(12) United States Patent
Shiota et al.

(10) Patent No.: US 7,960,253 B2
(45) Date of Patent: Jun. 14, 2011

(54) THIN SILICON WAFER WITH HIGH GETTERING ABILITY AND PRODUCTION METHOD THEREOF

(75) Inventors: Takaaki Shiota, Tokyo (JP); Takashi Nakayama, Tokyo (JP); Tomoyuki Kabasawa, Tokyo (JP)

(73) Assignee: SUMCO Corporation, Tokyo (JP)

( * ) Notice: Subject to any disclaimer, the term of this patent is extended or adjusted under 35 U.S.C. 154(b) by 19 days.

(21) Appl. No.: 12/436,692

(22) Filed: May 6, 2009

(65) Prior Publication Data

US 2009/0278239 A1 Nov. 12, 2009

(30) Foreign Application Priority Data

May 7, 2008 (JP) .................................. 2008-121716

(51) Int. Cl.
*H01L 21/20* (2006.01)
*H01L 21/36* (2006.01)
(52) U.S. Cl. ...................... 438/478; 438/692; 438/758
(58) Field of Classification Search .................. 438/692, 438/758, 759, 760, 795, 478, 502, 509; 257/E21.321
See application file for complete search history.

(56) References Cited

U.S. PATENT DOCUMENTS

| 2002/0004305 A1 | 1/2002 | Vasat et al. |
| 2004/0003769 A1* | 1/2004 | Tamatsuka et al. ............. 117/13 |
| 2004/0135208 A1 | 7/2004 | Tanahashi et al. |

FOREIGN PATENT DOCUMENTS

| EP | 1 758 154 A1 | 2/2007 |
| EP | 1 879 224 A2 | 1/2008 |
| JP | 2000-269221 A | 9/2000 |
| JP | 2003-257981 A | 9/2003 |
| KR | 2004-103222 A | 12/2004 |
| KR | 2007-23737 A | 2/2007 |

OTHER PUBLICATIONS

Korean Office Action of Feb. 7, 2011 for Korean Patent Application No. 10-2009-0039209. (with English translation).

* cited by examiner

*Primary Examiner* — Hoai v Pham
(74) *Attorney, Agent, or Firm* — Kilpatrick Townsend and Stockton LLP

(57) ABSTRACT

In a silicon wafer having an oxygen precipitate layer, a depth of DZ layer ranging from a wafer surface to an oxygen precipitate layer is 2 to 10 μm and an oxygen precipitate concentration of the oxygen precipitate layer is not less than $5 \times 10^7$ precipitates/$cm^3$.

6 Claims, 1 Drawing Sheet

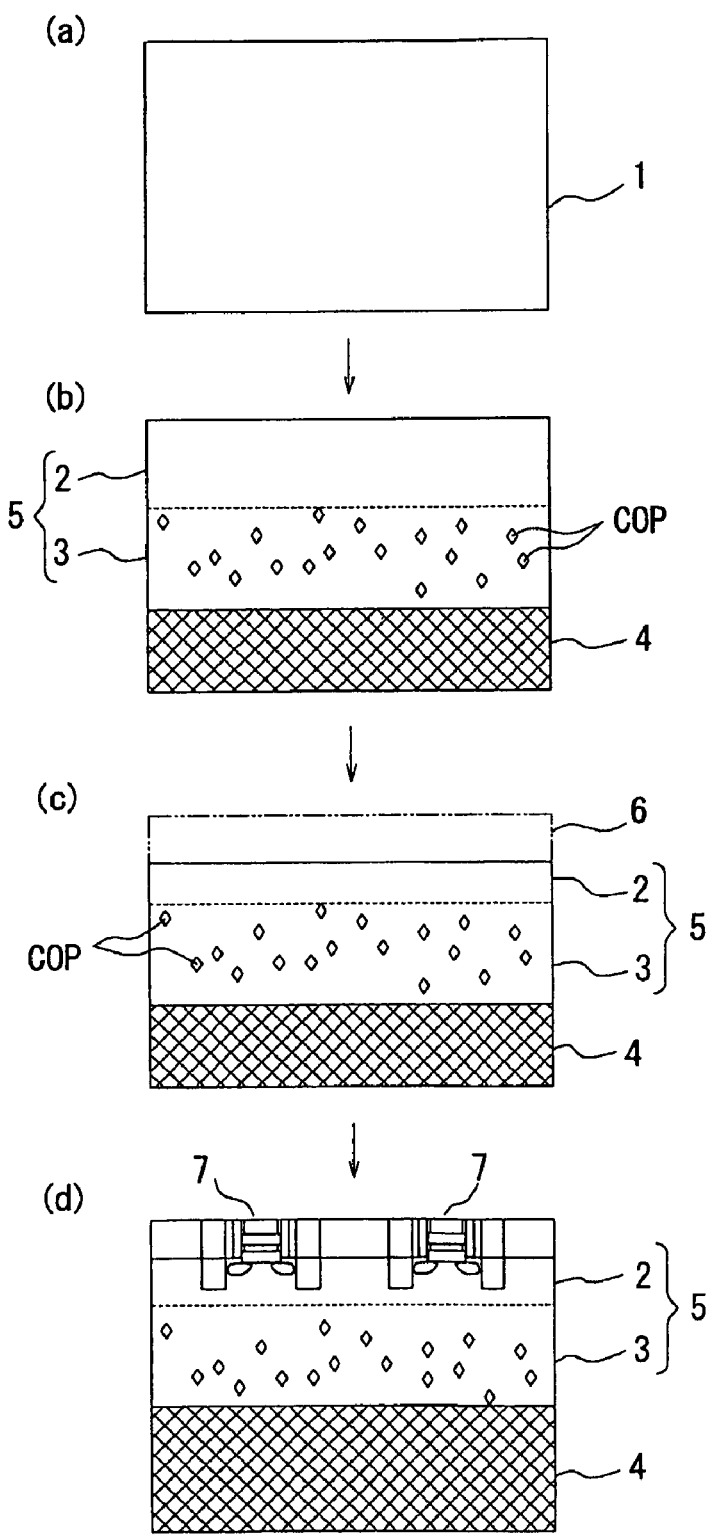

THIN SILICON WAFER WITH HIGH GETTERING ABILITY AND PRODUCTION METHOD THEREOF

CROSS REFERENCES TO RELATED APPLICATIONS

This application claims priority to Japanese Patent Application No. 2008-121716, filed May 7, 2008, the disclosure of which is incorporated by reference herein.

BACKGROUND OF THE INVENTION

1. Field of the Invention

This invention relates to a silicon wafer and a method of producing the same, and more particularly to a silicon wafer having a gettering means suitable for semiconductor device in very thin package and a method of producing the same.

2. Description of the Related Art

Recently, since some chips are set into the same package, for example, as in a multi-chip package (MCP) with higher integration of the semiconductor device, or as a matter of convenience in the packaging, it becomes widened to use a very thin silicon wafer. In advanced products will be used a silicon wafer having a thickness of 15 to 20 µm.

In general, when a silicon wafer is applied to a semiconductor process, there is a problem that a heavy metal as an impurity may be incorporated into the silicon wafer. The incorporation of the heavy metal significantly produces a bad influence on the device characteristics, e.g. bad pause time, bad retention, bad junction leakage and dielectric breakdown of oxide film. Therefore, it is common to adopt a gettering method for suppressing the diffusion of heavy metal into a device-forming (active) region located at a front face side of the silicon wafer.

However, the silicon wafer being thin in the thickness forms substantially an active layer, so that it hardly has a gettering site (capture region) on metal contamination anticipated in a packaging step. That is, it is required to form an active region for device formation in a front surface layer of the silicon wafer, and hence it is required to form a region having no defect due to oxygen precipitates (denuded zone: DZ layer) through a heat treatment. At the same time, an oxygen precipitate layer is formed inside the wafer by the heat treatment, which serves as a gettering site. Therefore, as the silicon wafer is thinned, the most part thereof is constituted with non-defective region.

As an example of forming the gettering site by the heat treatment,

JP-A-2000-269221 discloses that two-stage heat treatment and subsequent mirror polishing are conducted. However, the gettering site is in a depth region of 90 µm from the surface as described in the paragraph [0018] of JP-A-2000-269221, which is not applicable for the above thinning of the silicon wafer.

SUMMARY OF THE INVENTION

It is, therefore, an object of the invention to provide a silicon wafer having a high gettering ability without quality deterioration of a device active layer even when the silicon wafer is thinned and a method of producing the same.

The summary and construction of the invention are as follows.

(1) A silicon wafer having an oxygen precipitate layer, wherein a depth of DZ layer ranging from a wafer surface to an oxygen precipitate layer is 2 to 10 µm and an oxygen precipitation concentration of the oxygen precipitate layer is not less than $5 \times 10^7$ precipitates/cm$^3$.

(2) A silicon wafer according to the item (1), wherein the silicon wafer has a flatness by SFQR of not more than 70 nm and a surface roughness by Haze of not more than 0.05 ppm.

(3) A method of producing a silicon wafer, which comprises subjecting a silicon wafer to a heat treatment in a gaseous atmosphere containing either an inert gas or a reducing gas or both above 1150° C. for not less than 1 hour and then removing a surface layer of the silicon wafer so as to leave a thickness of 2 to 10 µm from the oxygen precipitate layer introduced into the silicon wafer by the heat treatment toward a front face side of the wafer.

(4) The method of producing a silicon wafer according to the item (3), wherein the surface layer of the silicon wafer is removed by double side polishing.

According to the invention, it is made possible to give a high gettering ability without quality deterioration of a device active layer even in a thin silicon wafer by appropriately controlling the depth from the device active layer to the oxygen precipitate layer for gettering metal impurities to be shallow. Therefore, it is possible to provide a silicon wafer suitable for a case that a semiconductor chip should be thinned.

BRIEF DESCRIPTION OF THE DRAWING

The invention will be described with reference to the accompanying drawing, wherein:

FIG. 1 is a flow chart illustrating production steps of an epitaxial wafer according to the invention.

DESCRIPTION OF THE PREFERRED EMBODIMENTS

The silicon wafer according to the invention and the production method thereof will be described with reference to the accompanying drawing, wherein FIG. 1 is a flow chart illustrating the production method of the silicon wafer according to the invention.

As shown in FIG. 1(*a*), a silicon wafer 1 is first subjected to a heat treatment in a gaseous atmosphere containing either an inert gas or a reducing gas or both above 1150° C. for not less than 1 hour, whereby a device active layer 2 extinguishing COP as a non-defective legion, a COP-remained layer 3 and an oxygen precipitate layer 4 are formed in this order from the surface of the wafer 1 toward the inside thereof as shown in FIG. 1(*b*). At this moment, a region from the surface of the wafer 1 onto the oxygen precipitate layer 4, namely a region from the device active layer 2 to the COP-remained layer 3 is called as a DZ layer 5.

By this heat treatment is firstly extinguished COP from a surface layer region of the wafer 1 to form the device active layer 2. In this case, the device active layer 2 is preferable to be formed at a thickness of 7 to 15 µm. Because, though the COP extinguishment and amount of oxygen precipitates can be simultaneously controlled by the control of oxygen concentration, in order to get the device active layer while forming the oxygen precipitate layer in a position as close as possible to the surface, it is required that the device active layer is formed while thinning the COP-remained layer as long as possible by the given heat treatment at a high temperature and then the device active layer is made to a given thickness by subsequent double side polishing. At this moment, when the thickness of the device active layer is thinner than 7 µm before the double side polishing, it is forced to reduce a margin for the double side polishing and thus the device performances are deteriorated. On the other hand, when the thickness of the device active layer exceeds 15 µm before the double side polishing, there is undesirably caused a scattering in the thickness of the device active layer after the polishing.

Moreover, it is important to form the oxygen precipitate layer 4 having an oxygen precipitate density of not less than $5 \times 10^7$ precipitates/cm$^3$ by the above heat treatment. When the oxygen precipitate density of the oxygen precipitate layer 4 is less than $5 \times 10^7$ precipitates/cm$^3$, it is difficult to protect the device active layer from metal contamination in the packaging step. Concretely, since an acceptable concentration of metal left on the surface of the wafer 1 after the packaging step is about $1 \times 10^{10}$ atoms/cm$^2$ according to the gettering test, in order to suppress the metal concentration to not more than $1 \times 10^{10}$ atoms/cm$^2$, it is required that the oxygen precipitate density of the oxygen precipitate layer 4 is not less than $5 \times 10^7$ precipitates/cm$^3$.

In order to form the device active layer 2 and the oxygen precipitate layer 4 under the above conditions, the heat treatment is carried out above 1150° C. for not less than 1 hour. Here, the upper limit of the heating temperature is preferable to be not higher than 1250° C. from the reason of device maintenance and for suppressing the occurrence of dislocation due to slip. Also, the upper limit of the heating time is preferable to be not more than 3 hours since the longer heating treatment causes the scattering in the thickness of the DZ layer and COP-remained layer and badly affects the device maintenance, productivity, cost and so on. More preferably, the heat treatment is carried out at 1175 to 1225° C. for 90 minutes to 2 hours.

Next, as shown in FIG. 1(*c*), a surface layer 6 of the silicon wafer is removed so as to leave a thickness of 2 to 10 µm from the oxygen precipitate layer 4 toward the front face side of the wafer, whereby the thickness of DZ layer 5 is adjusted to 2 to 10 µm. That is, when the thickness of the DZ layer 5 is less than 2 µm, the distance between the device active layer 2 and the oxygen precipitate layer 4 becomes too narrow, and hence the oxygen precipitate layer 4 and the COP-remained layer 3 badly affect a device to be provided in the device active layer 2 and further the performances of the device are deteriorated by dislocation generated from the precipitates. While, when the thickness of the DZ layer 5 exceeds 10 µm, as the thinning of the wafer proceeds and particularly the thickness of the wafer is thinned to about 20 µm, the function of the oxygen precipitate layer 4 as a gettering site lowers.

Moreover, it is preferable to conduct double side polishing for removing the surface layer 6 of the silicon wafer. That is, in order to attain the scale down of the device, the wafer is required to have a flatness by SFQR of about 70 nm, preferably not more than 50 nm and a surface roughness by Haze of not more than 0.05 ppm in the existing most-advanced line (design rule 65 nm). For the purpose of achieving this accuracy, it is desirable that the double side polishing is carried out to conduct the removal of the surface layer and the reduction of the surface roughness in the silicon wafer and simultaneously remove the irregularity of the back surface.

In the thus thinned silicon wafer, a device(s) is provided in the device active layer 2 to form a semiconductor chip.

Although the above is merely described with respect to one embodiment of the invention, various modifications may be made within the scope of the invention.

EXAMPLES

A silicon wafer is formed by subjecting a crystal doped with N at a concentration of $3 \times 10^{13}$ atoms/cm$^3$ and having an oxygen concentration of $(12-14) \times 10^{17}$ atoms/cm$^3$ and pulled over its full face at COP region to each treatment of slicing, lapping, grinding and cleaning steps. This silicon wafer is subjected to a heat treatment in an Ar atmosphere under various conditions shown in Table 1 and thereafter to a double side polishing treatment under conditions shown in Table 1 and then to a finish polishing for reducing the thickness by 0.5 µm.

Ni contamination is evenly applied onto the surface of the thus obtained wafer through a spin coat and then diffused by a heat treatment at 900° C. for 30 minutes. Thereafter, the surface layer of the wafer is recovered with HF solution, and the amount of residual contamination is measured by an inductively-coupled plasma mass spectrometry (ICP-MS). Furthermore, GOI non-defective rate is measured by MOS oxide film dielectric strength method (Gate Oxide Integrity (GOI) method) for evaluating contamination level. The GOI method relatively evaluates non-defective rate based on a predetermined judging value after the wafer is subjected to a thermal oxidation treatment and an electrode is formed on the wafer to prepare MOS and electric stress is applied to the MOS, or Light Point Defect (LPD), fabrication defect, contamination level and the like of the wafer before the thermal oxidation treatment by judging the quality of the oxide film from total charge amount put into the oxide film till the dielectric breakdown thereof. At this moment, the wafer is coated with Ni through spin coating and subjected to a heat treatment at 900° C. for 30 minutes and then an electrode area is formed to measure GOI non-defective rate.

The evaluation results on the contamination are also shown in Table 1.

TABLE 1

| Heat-treating condition | Depth of COP free region before polishing (µm) | Density of oxygen precipitate (precipitates/cm$^3$) | Depth of polishing (µm) | Depth of COP free region after polishing (µm) | Thickness of DZ layer (µm) | Amount of residual contamination (number/cm$^2$) | GOI (%) | Remarks |
|---|---|---|---|---|---|---|---|---|
| — | 0 | $\leq 5 \times 10^7$ | 0 | 0 | 0 | $5 \times 10^{11}$ | 0 | Conventional Example |
| 1200° C. × 2 h | 10 | $1 \times 10^{10}$ | 13.5 | (measurement impossible) | 1.5 | $<1 \times 10^9$ | 0 | Comparative Example (Due to dislocation from precipitation) |
| 1200° C. × 2 h | 10 | $1 \times 10^{10}$ | 13 | (measurement impossible) | 2.0 | $<1 \times 10^9$ | 70 | Example |
| 1200° C. × 2 h | 10 | $1 \times 10^{10}$ | 10 | (measurement impossible) | 5.0 | $<1 \times 10^9$ | 80 | Example |
| 1200° C. × 2 h | 10 | $1 \times 10^{10}$ | 7 | 3 | 8.0 | $5 \times 10^9$ | 100 | Example |
| 1200° C. × 2 h | 10 | $1 \times 10^{10}$ | 5 | 5 | 10.0 | $1 \times 10^{10}$ | 100 | Example |
| 1200° C. × 2 h | 10 | $1 \times 10^{10}$ | 4.5 | 5.5 | 10.5 | $5 \times 10^{10}$ | 65 | Comparative Example |
| 1200° C. × 2 h | 10 | $1 \times 10^{10}$ | 15 | 0 | 0 | $<1 \times 10^9$ | 0 | Comparative Example |

TABLE 1-continued

| Heat-treating condition | Depth of COP free region before polishing (μm) | Density of oxygen precipitate (precipitates/cm³) | Depth of polishing (μm) | Depth of COP free region after polishing (μm) | Thickness of DZ layer (μm) | Amount of residual contamination (number/cm²) | GOI (%) | Remarks |
|---|---|---|---|---|---|---|---|---|
| 1200° C. × 1.5 h | 8 | $8 \times 10^9$ | 7 | 1 | 6.5 | $<1 \times 10^9$ | 100 | Example |
| 1200° C. × 3 h | 13 | $1.5 \times 10^{10}$ | 10 | 3 | 8.0 | $<3 \times 10^9$ | 80 | Example (Occurrence of partial slip dislocation) |
| 1200° C. × 1 h | 7 | $5 \times 10^9$ | 6 | 1 | 6.0 | $5 \times 10^9$ | 100 | Example |
| 1200° C. × 1 h | 7 | $5 \times 10^9$ | 4 | 3 | 8.0 | $1 \times 10^{10}$ | 100 | Example |
| 1200° C. × 1 h | 7 | $5 \times 10^9$ | 2 | 5 | 10.0 | $5 \times 10^{10}$ | 100 | Example |
| 1200° C. × 1 h | 7 | $5 \times 10^9$ | 1 | 6 | 11.0 | $8 \times 10^{10}$ | 45 | Comparative Example |

As seen from the results of Table 1, the gettering effect on metal contamination is provided and GOI is made good by locating the oxygen precipitate layer close to the active layer and maintaining COP free with respect to the depth of the device active layer.

What is claimed is:

1. A method of producing a silicon wafer, which comprises subjecting a silicon wafer to a heat treatment in a gaseous atmosphere containing either an inert gas or a reducing gas or both above 1150° C. for not less than 1 hour and then removing a surface layer of the silicon wafer so as to leave a thickness of 2 to less than 5 μm from an oxygen precipitate layer introduced into the silicon wafer by the heat treatment toward a front face side of the wafer.

2. The method of producing a silicon wafer according to claim 1, wherein the surface layer of the silicon wafer is removed by double side polishing.

3. The method of producing a silicon wafer according to claim 2, wherein thickness of the device active layer after the heat treatment and prior to the double side polishing is in a range of 7 to 15 μm.

4. The method of producing a silicon wafer according to claim 1, further comprising forming a device active layer as a non-defective region extinguishing COP, a COP-remained layer, and the oxygen precipitate layer in this order from the front surface of the wafer toward the inside thereof.

5. The method of claim 1, wherein subjecting the silicon wafer to heat treatment further comprises limiting heating time to not more than 3 hours.

6. The method of claim 1, wherein subjecting a silicon wafer to heat treatment forms the oxygen precipitate layer having an oxygen precipitate concentration of not less than $5 \times 10^7$ precipitates/cm³.

* * * * *